(12) United States Patent
Kawakami (10) Patent No.: US 11,336,271 B2
(45) Date of Patent: May 17, 2022

(54) DATA HOLDING CIRCUIT

(71) Applicant: SONY SEMICONDUCTOR SOLUTIONS CORPORATION, Kanagawa (JP)

(72) Inventor: Atsushi Kawakami, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/283,653

(22) PCT Filed: Aug. 22, 2019

(86) PCT No.: PCT/JP2019/032774
§ 371 (c)(1),
(2) Date: Apr. 8, 2021

(87) PCT Pub. No.: WO2020/079951
PCT Pub. Date: Apr. 23, 2020

(65) Prior Publication Data
US 2021/0351766 A1    Nov. 11, 2021

(30) Foreign Application Priority Data
Oct. 16, 2018  (JP) .............................. JP2018-195058

(51) Int. Cl.
*H03K 3/037* (2006.01)
*H03K 3/356* (2006.01)
*H03K 3/3562* (2006.01)

(52) U.S. Cl.
CPC .......... *H03K 3/037* (2013.01); *H03K 3/0372* (2013.01); *H03K 3/35625* (2013.01);
(Continued)

(58) Field of Classification Search
CPC ................ H03K 3/037; H03K 3/0372; H03K 3/356121; H03K 3/356165;
(Continued)

(56) References Cited

U.S. PATENT DOCUMENTS 8,519,743 B2 * 8/2013 Teh .................. H03K 3/356156
326/95
8,941,428 B2 * 1/2015 Javerliac ................ G11C 11/412
327/202

(Continued)

FOREIGN PATENT DOCUMENTS

JP    02-082711 A    3/1990
JP    11-150458 A    6/1999
(Continued)

OTHER PUBLICATIONS

International Search Report and Written Opinion of PCT Application No. PCT/JP2019/032774, dated Nov. 19, 2019, 06 pages of ISRWO.

*Primary Examiner* — Patrick O Neill
(74) *Attorney, Agent, or Firm* — Chip Law Group (57) ABSTRACT

To provide a miniaturized data holding circuit. First and second MOS transistors respectively transmit a data signal and an inverted data signal to inputs of first and second inverting gates that constitute a state holding circuit when a clock signal is at a first level. Fifth and sixth MOS transistors are respectively inserted in a feedback path from an output of the second inverting gate to the input of the first inverting gate and a feedback path from an output of the first inverting gate to the input of the second inverting gate, and respectively transmit the outputs of the second and first inverting gates when the clock signal is at a second signal level. Seventh and eighth MOS transistors are constituted in a channel of a conductive type different from the first MOS transistor and connected in parallel to the fifth and sixth (Continued)

MOS transistors, respectively, and transmit the output of the second inverting gate and the output of the first inverting gate on the basis of the inverted data signal and the data signal, respectively.

5 Claims, 8 Drawing Sheets

(52) U.S. Cl.
 CPC . *H03K 3/356121* (2013.01); *H03K 3/356165* (2013.01); *H03K 3/356182* (2013.01)
(58) Field of Classification Search
 CPC ....... H03K 3/356173; H03K 3/356182; H03K 3/356191; H03K 3/35625
 See application file for complete search history.

(56) References Cited

U.S. PATENT DOCUMENTS

| | | | |
|---|---|---|---|
| 9,130,555 B2* | 9/2015 | Tanabe | ................... H03K 3/012 |
| 2014/0312950 A1 | 10/2014 | Tanabe et al. | |

FOREIGN PATENT DOCUMENTS

| | | |
|---|---|---|
| JP | 2011-029828 A | 2/2011 |
| JP | 2014-216665 A | 11/2014 |

\* cited by examiner

FIG. 9

DATA HOLDING CIRCUIT

CROSS REFERENCE TO RELATED APPLICATIONS

This application is a U.S. National Phase of International Patent Application No. PCT/JP2019/032774 filed on Aug. 22, 2019, which claims priority benefit of Japanese Patent Application No. JP 2018-195058 filed in the Japan Patent Office on Oct. 16, 2018. Each of the above-referenced applications is hereby incorporated herein by reference in its entirety.

TECHNICAL FIELD

The present disclosure relates to a data holding circuit. More specifically, the present disclosure relates to a data holding circuit that holds data in synchronization with a clock signal.

BACKGROUND ART

In a conventional D-type flip-flop used for a logic circuit, two flip-flops are connected in cascade and constitute feedback paths in which an output of each of two inverters is cross-connected to an input of the other inverter. In this D-type flip-flop, assuming that the two flip-flops described above are first and second flip-flops, a clocked inverter is arranged between the first flip-flop and the second flip-flop. Furthermore, a clocked inverter is also arranged between a data signal input and the first flip-flop. Each of these two clocked inverters is driven by a clock signal with opposite phase. That is, an input of a data signal in the first flip-flop and an input to the second flip-flop of an output of the first flip-flop are repeated every half cycle of the clock signal. An output of the second flip-flop corresponds to an output signal of the D-type flip-flop.

In the above-described D-type flip-flop, an inverter that inverts an input clock signal is arranged for the purpose of generating a clock signal with opposite phase. An output of this inverter is inverted on the basis of the cycle of the clock signal, and this increases power consumption.

It has therefore been proposed a D-type flip-flop in which a p-channel MOS transistor and an n-channel MOS transistor are arranged instead of the clocked inverters, and the clock signal with opposite phase is omitted. For example, a p-channel MOS transistor is arranged between the data signal input and one input of the first flip-flop, and an inverted data signal obtained by inverting a data signal is input to the other input of the first flip-flop via another p-channel MOS transistor. Moreover, a D-type flip-flop in which n-channel MOS transistors are arranged, one each between two outputs of the first flip-flop and two inputs of the second flip-flop has been proposed. Inputting the same clock signal to gates of these p-channel MOS transistors and n-channel MOS transistors causes these MOS transistors to be alternately brought into a conductive state and allows data to be transferred. The clock signal with opposite phase can be omitted.

However, since a MOS transistor is used to input a data signal to a flip-flop, it is difficult in some cases to invert a state held in the flip-flop in a case where a state held in the flip-flop differs from a logic of the data signal transmitted by the MOS transistor. In a case where a p-channel MOS transistor is arranged between the data signal input and the first flip-flop, the p-channel MOS transistor becomes conductive when a clock signal applied to the gate of the p-channel MOS transistor is at a low level. At this time, in a case where the input data signal is at a high level, that is, in a case where the input of the first flip-flop is charged to a high level, the p-channel MOS transistor has a relatively high drive capability.

On the other hand, in a case where the input data signal is at a low level and the input of the first flip-flop is discharged to the low level, the drive capability is reduced. This is because, due to an influence of a threshold voltage Vth between the gate and the source, a voltage after the discharge at the input of the first flip-flop is Vth higher than the low level voltage. Thus, the input voltage of the first flip-flop does not drop to the low level. As a result of a contention with the output of the first flip-flop (inverter output) cross-connected to this input, a case arises where the input of the first flip-flop cannot be inverted.

It has therefore been proposed a D-type flip-flop in which a p-channel MOS transistor and an n-channel MOS transistor connected in parallel between outputs and inputs of cross-connected inverters are added to a first flip-flop (for example, see Patent Document 1). The gates of the added p-channel MOS transistor and n-channel MOS transistor are driven by a common data signal. At this time, an inverted data signal obtained by inverting a data signal supplied to the input of the first flip-flop to which the added p-channel MOS transistor and the like are connected is applied to the gates of the added p-channel MOS transistor and n-channel MOS transistor. Specifically, the inverted data signal is applied to the gates of the p-channel MOS transistor and the n-channel MOS transistor connected to the input of the first flip-flop to which the data signal is transmitted. On the other hand, the data signal is applied to the gates of the p-channel MOS transistor and the n-channel MOS transistor connected to another input of the first flip-flop to which the inverted data signal is transmitted.

As a result, in a case where the input of the first flip-flop to which the added p-channel MOS transistor and n-channel MOS transistor are connected is at a low level, the p-channel MOS transistor is conductive. On the other hand, in a case where the input of the first flip-flop is at a high level, the re-channel MOS transistor becomes conductive and the output of the inverter is fed back to the input side. As described above, in transmission of a low level signal by the p-channel MOS transistor and transmission of a high level signal by the re-channel MOS transistor, the drive capability is reduced, and the drive capability from the output of the inverter of the first flip-flop to the input side is reduced. As a result, it possible to easily invert the state held in the first flip-flop by the p-channel MOS transistor that transmits the input data signal to the flip-flop.

CITATION LIST

Patent Document

Patent Document 1: Japanese Patent Application Laid-Open No. 2011-029828

SUMMARY OF THE INVENTION

Problems to be Solved by the Invention

The above-described conventional technology has a problem in that a p-channel MOS transistor that transmits input data and has a higher drive capability than the p-channel MOS transistor and n-channel MOS transistor added to the feedback path in the first flip-flop is required. This is because it is necessary to ensure that the state held in the first flip-flop is inverted by the p-channel MOS transistor that transmits the input data. As described above, even in a case where the drive capability of the p-channel MOS transistor and n-channel MOS transistor added to the feedback path is lowered, it is necessary to provide a margin to the drive capability of the MOS transistor in order to eliminate an influence of a variation in manufacturing process or the like. Specifically, as the p-channel MOS transistor that transmits the input data, a MOS transistor of a size larger than that of the p-channel MOS transistor arranged in the feedback path is used. However, arranging MOS transistors of different sizes in this way results in an increase in chip size.

The present disclosure has been made in view of the above-described problems, and is aimed at preventing an increase in size of MOS transistors in a data holding circuit and miniaturizing the data holding circuit.

Solutions to Problems

The present disclosure has been made to solve the above-described problems, and a first aspect thereof provides a data holding circuit including a state holding circuit that holds two states and is constituted by a first inverting gate and a second inverting gate in which an output of each inverting gate is fed back to an input of another inverting gate by cross-connected feedback paths, a first MOS transistor that transmits a data signal to the input of the first inverting gate when a clock signal is at a first level, a second MOS transistor that transmits an inverted data signal obtained by inverting the data signal, to the input of the second inverting gate when the clock signal is at the first level, a third MOS transistor that transmits the state held in the first inverting gate when the clock signal is at a second signal level, a fourth MOS transistor that transmits the state held in the second inverting gate when the clock signal is at the second signal level, a fifth MOS transistor that is inserted in the feedback path from the output of the second inverting gate to the input of the first inverting gate and transmits the output of the second inverting gate to the input of the first inverting gate when the clock signal is at the second signal level, a sixth MOS transistor that is inserted in the feedback path from the output of the first inverting gate to the input of the second inverting gate and transmits the output of the first inverting gate to the input of the second inverting gate when the clock signal is at the second signal level, a seventh MOS transistor that is constituted in a channel of a conductive type different from the first MOS transistor and connected in parallel to the fifth MOS transistor, and transmits the output of the second inverting gate to the input of the first inverting gate on the basis of the inverted data signal, and an eighth MOS transistor that is constituted in a channel of a conductive type different from the second MOS transistor and connected in parallel to the sixth MOS transistor, and transmits the output of the first inverting gate to the input of the second inverting gate on the basis of the data signal.

Furthermore, in this first aspect, a second state holding circuit that holds the states transmitted by the third MOS transistor and the fourth MOS transistor, and an output unit that transmits the state held in the second state holding circuit as an output signal may be further included.

Furthermore, in this first aspect, the data holding circuit may constitute a standard cell.

Furthermore, in this first aspect, the clock signal may be input from an input terminal of the standard cell to the data holding circuit without passing through a buffer.

Furthermore, a second aspect of the present disclosure provides a data holding circuit including a first MOS transistor to which a data signal is input, a first inverting gate that has an input to which an output of the first MOS transistor is connected, a third MOS transistor that has an input to which an output of the first inverting gate is connected, a sixth MOS transistor and an eighth MOS transistor that are connected in parallel to each other and have inputs to which the output of the first inverting gate is connected, a third inverting gate that has an input to which an output of the third MOS transistor is connected, a second MOS transistor to which an inverted data signal obtained by logically inverting the data signal is input, a second inverting gate that has an input to which an output of the second MOS transistor is connected, a fourth MOS transistor that has an input to which an output of the second inverting gate is connected, a fifth MOS transistor and a seventh MOS transistor that are connected in parallel to each other and have inputs to which the output of the second inverting gate is connected, and a fourth inverting gate that has an input to which an output of the fourth MOS transistor is connected, in which outputs of the sixth MOS transistor and the eighth MOS transistor are further connected to the input of the second inverting gate, outputs of the fifth MOS transistor and the seventh MOS transistor are further connected to the input of the first inverting gate, an output of the third inverting gate is further connected to the input of the fourth inverting gate, an output of the fourth inverting gate is further connected to the input of the third inverting gate, the same control signal is input to gates of the first to sixth MOS transistors, the data signal is input to a gate of the eighth MOS transistor, the inverted data signal is input to a gate of the seventh MOS transistor, and the first and second MOS transistors are constituted in a conductive channel type different from the third to eighth MOS transistors.

Adopting the above-described aspects yields an effect of connecting a MOS transistor that transmits a data signal to an input of an inverting gate constituting a state holding circuit, and a conductive channel type MOS transistor that constitutes a feedback path and is different from the MOS transistor. Furthermore, the MOS transistor that constitutes the feedback path yields an effect of applying, to a gate, a signal obtained by inverting the logic of the data signal. As a result, it is expected that a contention between the output voltage of the MOS transistor that transmits the data signal and the output voltage of the MOS transistor that constitutes the feedback path is avoided.

MODE FOR CARRYING OUT THE INVENTION

Next, modes for carrying out the present disclosure (hereinafter referred to as embodiments) will be described with reference to the drawings. In the following drawings, the same or similar parts are denoted by the same or similar reference numerals. Note that the drawings are schematic, and the ratio of dimensions of each part and the like do not always match that of an actual one. Furthermore, it goes without saying that there may be differences in dimensional relationship and ratio of dimensions among the drawings. Furthermore, the embodiments will be described in the following order.
1. First embodiment
2. Second embodiment
3. Effects of embodiments
4. Example of application to standard cell <1. First Embodiment>
[Configuration of data holding circuit]

Figure 1:
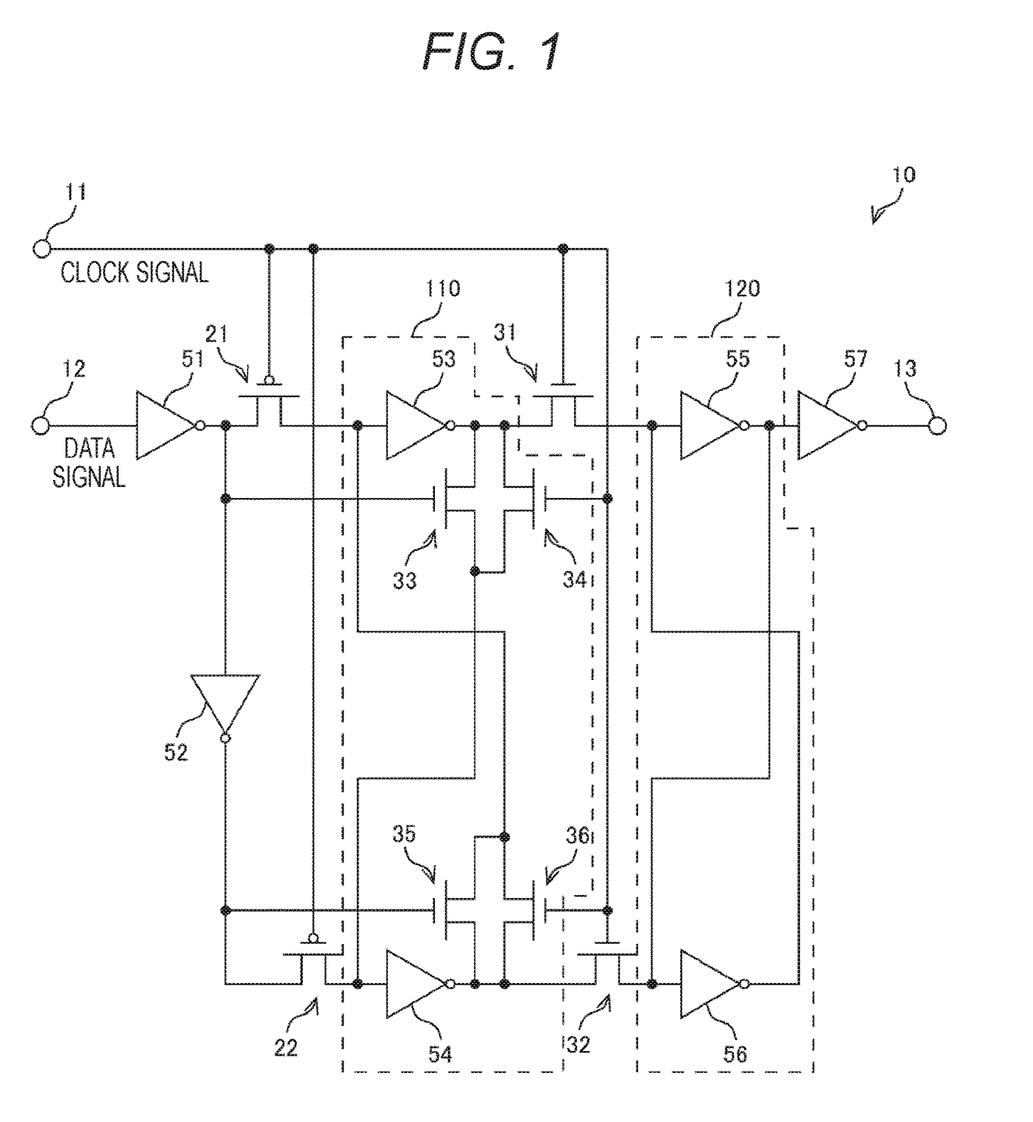
FIG. 1 is a diagram illustrating a configuration example of a data holding circuit according to a first embodiment of the present disclosure.

FIG. 1 is a diagram illustrating a configuration example of a data holding circuit according to a first embodiment of the present disclosure. The drawing is a circuit diagram illustrating a configuration example of a data holding circuit 10. The data holding circuit 10 in the drawing includes input terminals 11 and 12, an output terminal 13, MOS transistors 21, 22, and 31 to 36, and inverting gates 51 to 57. As the MOS transistors 21 and 22, p-channel MOS transistors can be used. As the MOS transistors 31 to 36, n-channel MOS transistors can be used.

The data holding circuit 10 in the drawing holds a data signal input to the input terminal 12 in synchronization with a clock signal input to the input terminal 11, and outputs the held data signal to the output terminal 13. An input of the inverting gate 51 is connected to the input terminal 12. An output of the inverting gate 51 is connected to an input of the inverting gate 52, a source of the MOS transistor 21, and a gate of the MOS transistor 33. An output of the inverting gate 52 is connected to a source of the MOS transistor 22 and a gate of the MOS transistor 35. A drain of the MOS transistor 21 is connected to an input of the inverting gate 53, a drain of the MOS transistor 35, and a drain of the MOS transistor 36. A drain of the MOS transistor 22 is connected to an input of the inverting gate 54, a drain of the MOS transistor 33, and a drain of the MOS transistor 34.

An output of the inverting gate 53 is connected to a source of the MOS transistor 31, a source of the MOS transistor 33, and a source of the MOS transistor 34. An output of the inverting gate 54 is connected to a source of the MOS transistor 32, a source of the MOS transistor 35, and a source of the MOS transistor 36. A drain of the MOS transistor 31 is connected to an input of the inverting gate 55, and an output of the inverting gate 56. A drain of the MOS transistor 32 is connected to an input of the inverting gate 56, an output of the inverting gate 55, and an input of the inverting gate 57. An output of the inverting gate 57 is connected to the output terminal 13. Gates of the MOS transistors 21, 22, 31, 32, 34, and 36 are commonly connected to the input terminal 11.

In the inverting gates 53 and 54, the output of each inverting gate is fed back to the input of the other inverting gate by cross-connected feedback paths. That is, the inverting gates 53 and 54 constitute a state holding circuit 110 in which the output of each inverting gate is connected to the input of the other inverting gate. The state holding circuit 110 holds a state of a data signal input from the input terminal 12. Specifically, the state of the input data signal, that is, either a high level or a low level, is held. Note that, in the state holding circuit 110 in the drawing, the MOS transistors 33 and 34 are inserted in one feedback path, and the MOS transistors 35 and 36 are inserted in the other feedback path. Note that the state holding circuit 110 is an example of the state holding circuit described in the claims. The inverting gate 54 is an example of the first inverting gate described in the claims. The inverting gate 53 is an example of the second inverting gate described in the claims.

In a similar manner, the inverting gates 55 and 56 constitute a state holding circuit 120 in which the output of each inverting gate is fed back to the input of the other inverting gate by cross-connected feedback paths. That is, an output of each of the inverting gates 55 and 56 is connected to an input of the other inverting gate. The state holding circuits 110 and 120 are connected in cascade and constitute a so-called master-slave D-type flip-flop. Note that the state holding circuit 120 is an example of the second state holding circuit described in the claims. The inverting gate 55 is an example of the fourth inverting gate described in the claims. The inverting gate 56 is an example of the third inverting gate described in the claims.

A data signal input from the input terminal 12 is converted into an inverted data signal, which is a data signal having a logic inverted by the inverting gate 51. The inverted data signal is converted into a signal having the same logic as a data signal that has a logic inverted again by the inverting gate 52 and input to the input terminal 12. Hereinafter, an output signal of the inverting gate 52 is also referred to as a data signal. The inverting gates 51 and 52 also correspond to buffers for data signals.

The MOS transistor 21 is connected between the output of the inverting gate 51 and the input of the inverting gate 53, and transmits an inverted data signal to the input of the inverting gate 53. The MOS transistor 21 transmits inverted data to the state holding circuit 110 on the basis of a clock signal input from the input terminal 11. As described previously, the MOS transistor 21 is constituted by a p-channel MOS transistor, and becomes conductive between the drain and source when the clock signal is at a low level. Thus, when the clock signal is at a low level, the inverted data signal is transmitted to the input of the inverting gate 53. Note that the MOS transistor 21 is an example of the second MOS transistor described in the claims. The low level is an example of the first level described in the claims. The clock signal is an example of the control signal described in the claims.

The MOS transistor 22 is connected between the output of the inverting gate 52 and the input of the inverting gate 54, and transmits a data signal to the input of the inverting gate 54. In a similar manner to the MOS transistor 21, the MOS transistor 22 is constituted by a p-channel MOS transistor, and transmits a data signal to the state holding circuit 110 on the basis of a clock signal input from the input terminal 11. That is, when the clock signal is at a low level, the data signal is transmitted to the input of the inverting gate 54. The MOS transistors 21 and 22 cause the inverted data signal and the data signal to be input to the state holding circuit 110. Note that the MOS transistor 22 is an example of the first MOS transistor described in the claims.

The MOS transistor 31 is connected between the output of the inverting gate 53 and the input of the inverting gate 55. On the basis of a clock signal, the MOS transistor 31 transmits, to the inverting gate 55, a signal held in the inverting gate 53 in the same logic state as a data signal. That is, the data signal is transmitted to the state holding circuit 120. As described previously, the MOS transistor 31 is constituted by an n-channel MOS transistor, and becomes conductive between the drain and source when the clock signal is at a high level. Thus, when the clock signal is at a high level, the data signal is transmitted to the input of the inverting gate 55. Note that the MOS transistor 31 is an example of the fourth MOS transistor described in the claims. The high level is an example of the second level described in the claims.

The MOS transistor 32 is connected between the output of the inverting gate 54 and the input of the inverting gate 56. In a similar manner to the MOS transistor 31, the MOS transistor 32 is constituted by an n-channel MOS transistor, and transmits, from the inverting gate 54 to the inverting gate 56, a signal in the same logic state as an inverted data signal on the basis of a clock signal. When the clock signal is at a high level, the inverted data signal is transmitted to the input of the inverting gate 56. The MOS transistors 31 and 32 cause the data signal and the inverted data signal to be input to the state holding circuit 120. Note that the MOS transistor 32 is an example of the third MOS transistor described in the claims.

In this way, the MOS transistors 21 and 22 constituted by p-channel MOS transistors are arranged between the inverting gates 51 and 52 and the state holding circuit 110. The MOS transistors 31 and 32 constituted by n-channel MOS transistors are arranged between the state holding circuits 110 and 120. As a result, transmission of the data signal and the inverted data signal to the state holding circuit 110 and transmission of the data signal and the inverted data signal from the state holding circuit 110 to the state holding circuit 120 are continuously executed in one cycle of the clock signal. It is possible to transfer and hold the data signal in the state holding circuits 110 and 120 connected in cascade without using a signal obtained by inverting the clock signal. The output of the inverting gate 55 constituting the state holding circuit 120 is transmitted to the output terminal 13 via the inverting gate 57. Note that the inverting gate 57 is an example of the output unit described in the claims.

The MOS transistor 36 is connected between the output of the inverting gate 54 and the input of the inverting gate 53, and transmits an inverted data signal. The MOS transistor 36 is inserted in a feedback path from the output of the inverting gate 54 to the input of the inverting gate 53. Furthermore, the MOS transistor 36 is constituted by an n-channel MOS transistor, and transmits the output of the inverting gate 54 to the input of the inverting gate 53 when a clock signal is at a high level. Note that the MOS transistor 36 is an example of the sixth MOS transistor described in the claims.

The MOS transistor 34 is connected between the output of the inverting gate 53 and the input of the inverting gate 54, and transmits a data signal. The MOS transistor 34 is inserted in a feedback path from the output of the inverting gate 53 to the input of the inverting gate 54. Furthermore, in a similar manner to the MOS transistor 36, the MOS transistor 34 is constituted by an n-channel MOS transistor, and transmits the output of the inverting gate 53 to the input of the inverting gate 54 when a clock signal is at a high level. Note that the MOS transistor 34 is an example of the fifth MOS transistor described in the claims.

In this way, the MOS transistors 36 and 34 are configured in a conductive channel type different from the MOS transistors 21 and 22. The MOS transistors 36 and 34 become conductive after the MOS transistors 21 and 22 have transmitted the inverted data signal and the data signal to the inverting gates 53 and 54, respectively. Then, output signals of the inverting gates 54 and 53 are transmitted to the inputs of the inverting gates 53 and 54, respectively.

The MOS transistor 35 is connected in parallel to the MOS transistor 36, and transmits the output of the inverting gate 54 to the input of the inverting gate 53. The MOS transistor 35 is constituted by an n-channel MOS transistor, which is a conductive channel type different from the MOS transistor 21, and the gate is connected to an output node of the inverting gate 52. Thus, the output signal of the inverting gate 54 is transmitted to the input of the inverting gate 53 on the basis of the data signal. Note that the MOS transistor 35 is an example of the eighth MOS transistor described in the claims.

The MOS transistor 33 is connected in parallel to the MOS transistor 34, and transmits the output of the inverting gate 53 to the input of the inverting gate 54. The MOS transistor 33 is constituted by an n-channel MOS transistor, which is a conductive channel type different from the MOS transistor 21, and the gate is connected to an output node of the inverting gate 51. Thus, the output signal of the inverting gate 53 is transmitted to the input of the inverting gate 54 on the basis of the inverted data signal. Note that the MOS transistor 33 is an example of the seventh MOS transistor described in the claims.

An operation of a circuit will be described with a case where a data signal is at a high level taken as an example. When the data signal becomes a high level, the output node of the inverting gate 51 and the output node of the inverting gate 52 become a low level and a high level, respectively. As a result, the MOS transistor 35 becomes conductive, and the MOS transistor 33 becomes non-conductive. Since the MOS transistor 21 is constituted by a p-channel MOS transistor, the drive capability is reduced in a case where the output node of the inverting gate 51 is at a low level. In a case where the input and output of the inverting gate 53 are at a high level and a low level, respectively, the input voltage of the inverting gate 53 does not drop sufficiently, so that the output of the inverting gate 53 cannot be inverted by the MOS transistor 21 alone. On the other hand, since the output node of the inverting gate 52 is at a high level, the drive capability of the MOS transistor 22 is relatively high. Combined with the fact that the MOS transistors 33 and 34 are non-conductive, the input voltage of the inverting gate 54 exceeds a threshold value, and the output of the inverting gate 54 is inverted into a low level. As a result of the input of the inverting gate 53 changing to a low level via the MOS transistor 35 in a conductive state, the output of the inverting gate 53 is inverted into a high level.

As described above, a MOS transistor (the MOS transistor 21) that transmits a data signal is connected to an input of an inverting gate (the inverting gate 53) that constitutes a state holding circuit. A conductive channel type MOS transistor (the MOS transistor 35) different from the above-mentioned MOS transistor is arranged in a feedback path further connected to the input of the inverting gate, and a signal obtained by inverting the logic of the data signal is applied to the gate. With such a configuration, even in a case of transmission of a data signal of a voltage level at which the drive capability of the MOS transistor that transmits an input data signal to the state holding circuit is reduced, the output voltage of the other inverting gate that constitutes the state holding circuit is applied via the feedback path. The output voltage of the inverting gate can be inverted in place of the MOS transistor having an insufficient drive capability.

On the other hand, in a case of transmission of a data signal of a voltage level at which the drive capability of the MOS transistor that transmits an input signal to the state holding circuit can be maintained, the MOS transistor arranged in the feedback path becomes non-conductive. Furthermore, a MOS transistor to the gate of which a clock signal is applied is connected in parallel to the MOS transistor arranged in the feedback path. The MOS transistor connected in parallel can avoid a contention with the MOS transistor that becomes conductive and maintain the feedback path when the data signal is held after the data signal has been input, and becomes non-conductive when the data signal is input and transmits the input signal to the state holding circuit. Thus, it is possible to prevent a contention between the output voltage of the MOS transistor constituting the state holding circuit and the output voltage of the MOS transistor that transmits the data signal to the state holding circuit. These MOS transistors can have substantially the same size, and a MOS transistor of a minimum size in accordance with a process to be adopted and a working voltage can be arranged in the data holding circuit 10.

Furthermore, since a signal obtained by inverting the logic of the clock signal is not used, the power consumption can be reduced. Note that, in the data holding circuit 10 in the drawing, the gates of six MOS transistors are connected to the input terminal 11 to which the clock signal is applied, and this increases a load capacitance of a clock signal line. Arranging a buffer between the clock signal line and wiring to the gate of each MOS transistor allows for a reduction of the load capacitance of the clock signal line.

[First modified example]

The data holding circuit 10 described above generates an inverted data signal by an inverting gate arranged inside. Alternatively, the data holding circuit 10 may input an inverted data signal from an external circuit.

[Configuration of data holding circuit]

Figure 2:
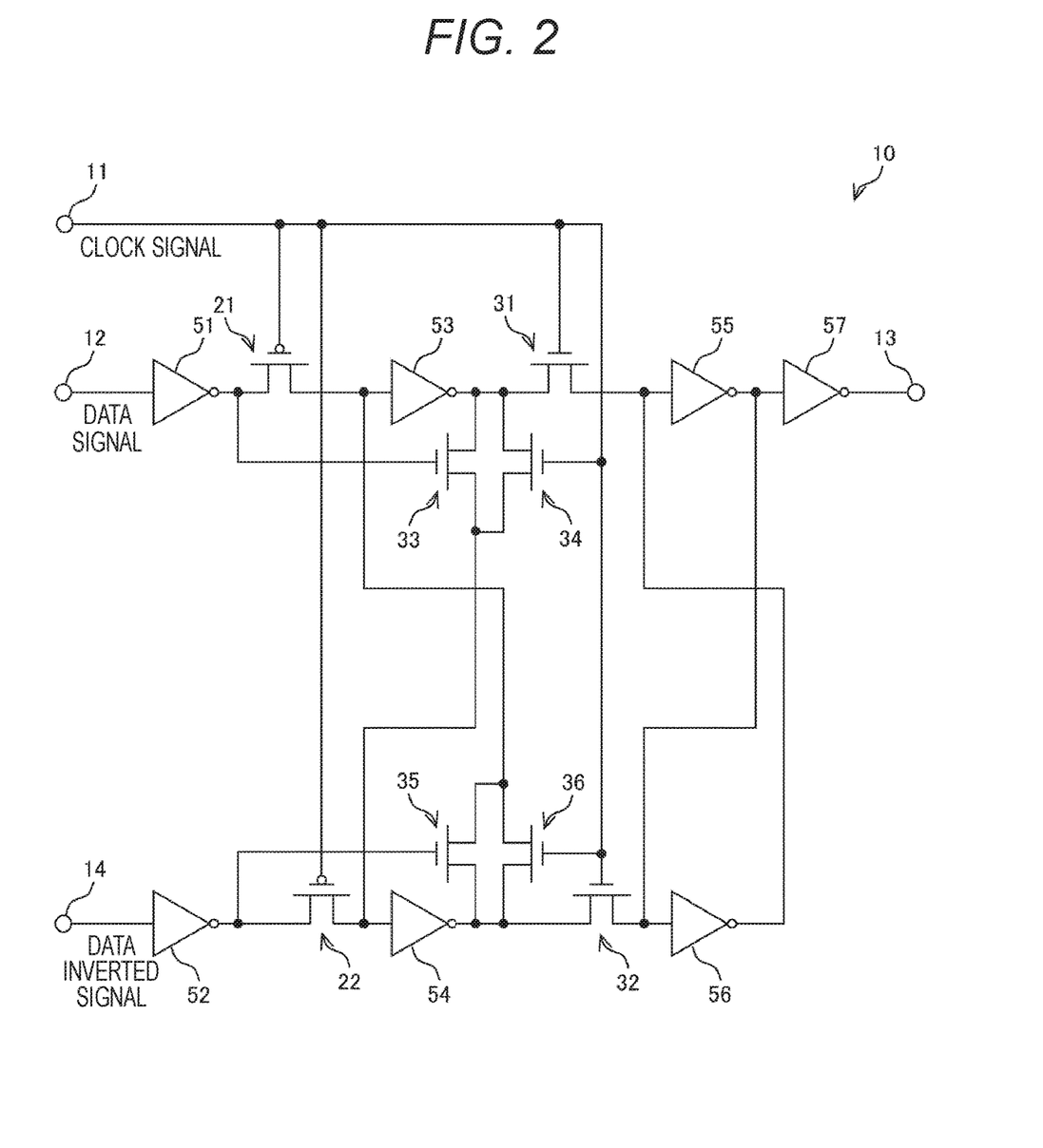
FIG. 2 is a diagram illustrating a configuration example of a data holding circuit according to a first modified example of the first embodiment of the present disclosure.

FIG. 2 is a diagram illustrating a configuration example of a data holding circuit according to a first modified example of the first embodiment of the present disclosure. The data holding circuit 10 in the drawing is different from the data holding circuit 10 described with reference to FIG. 1 in that an input terminal 14 is further included, and that the input of the inverting gate 52 is connected to the input terminal 14. A signal obtained by inverting the logic of the data signal input to the input terminal 12 is input to the input terminal 14.

[Second modified example]

The data holding circuit 10 described above is configured as a D-type flip-flop. Alternatively, the data holding circuit 10 may input a reset signal.

[Configuration of data holding circuit]

Figure 3:
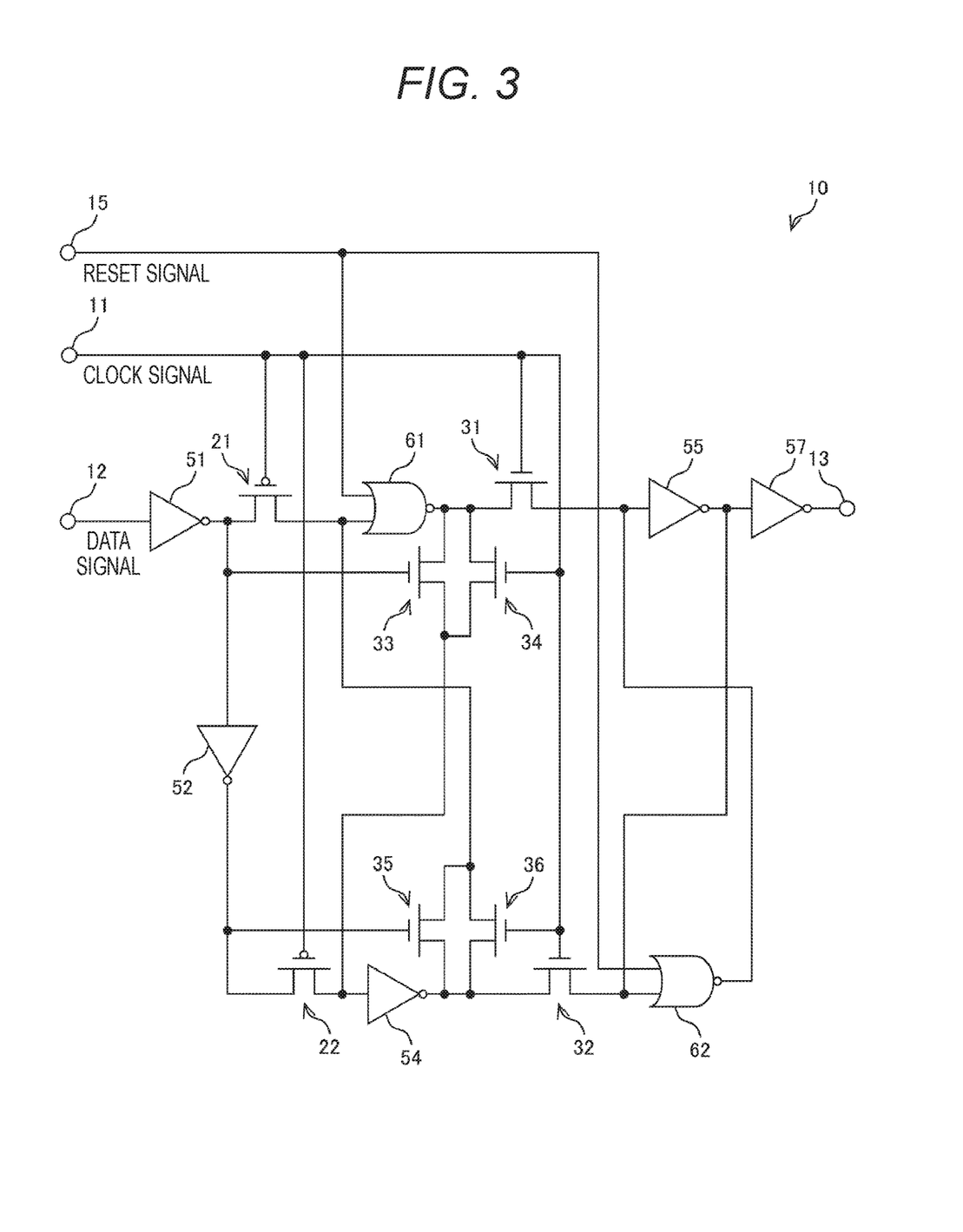
FIG. 3 is a diagram illustrating a configuration example of a data holding circuit according to a second modified example of the first embodiment of the present disclosure.

FIG. 3 is a diagram illustrating a configuration example of a data holding circuit according to a second modified example of the first embodiment of the present disclosure. The data holding circuit 10 in the drawing is different from the data holding circuit 10 described with reference to FIG. 1 in that an input terminal 15 is further included, and that two-input NOR gates 61 and 62 are arranged instead of the inverting gates 53 and 56, respectively. A reset signal is input to the input terminal 15. One input of the NOR gate 61 is connected to the input terminal 15, and the other input is connected to the drain of the MOS transistor 21, the drain of the MOS transistor 35, and the drain of the MOS transistor 36. The output of the NOR gate 61 is connected to the source of the MOS transistor 31, the source of the MOS transistor 33, and the source of the MOS transistor 34. One input of the NOR gate 62 is connected to the input terminal 15, and the other input is connected to the drain of the MOS transistor 32, the output of the inverting gate 55, and the input of the inverting gate 57. The output of the NOR gate 62 is connected to the drain of the MOS transistor 31 and the input of the inverting gate 55.

Arranging the NOR gates 61 and 62 and inputting a reset signal to them makes it possible to initialize the state holding circuit in which these NOR gates are arranged, and set the output of the data holding circuit 10 to a value "0" (low level).

[Third modified example]

The data holding circuit 10 described above is configured as a D-type flip-flop. Alternatively, the data holding circuit 10 may input a set signal.

[Configuration of data holding circuit]

Figure 4:
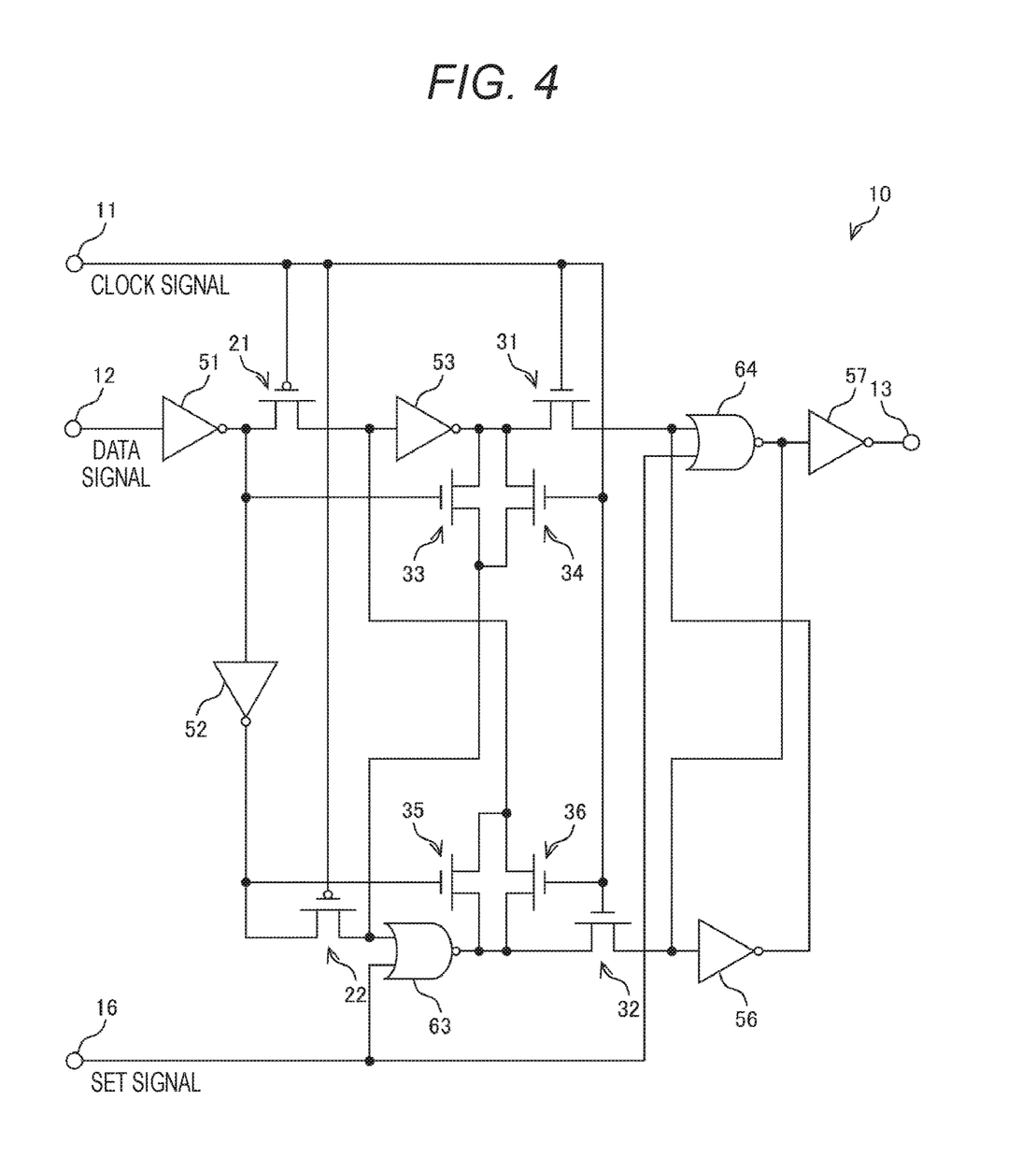
FIG. 4 is a diagram illustrating a configuration example of a data holding circuit according to a third modified example of the first embodiment of the present disclosure.

FIG. 4 is a diagram illustrating a configuration example of a data holding circuit according to a third modified example of the first embodiment of the present disclosure. The data holding circuit 10 in the drawing is different from the data holding circuit 10 described with reference to FIG. 1 in that an input terminal 16 is further included, and that two-input NOR gates 63 and 64 are arranged instead of the inverting gates 54 and 55, respectively. A set signal is input to the input terminal 16. One input of the NOR gate 63 is connected to the input terminal 16, and the other input is connected to the drain of the MOS transistor 22, the drain of the MOS transistor 33, and the drain of the MOS transistor 34. The output of the NOR gate 63 is connected to the source of the MOS transistor 32, the source of the MOS transistor 35, and the source of the MOS transistor 36. One input of the NOR gate 64 is connected to the input terminal 16, and the other input is connected to the drain of the MOS transistor 31 and the output of the inverting gate 56. The output of the NOR gate 64 is connected to the drain of the MOS transistor 32, the input of the inverting gate 56, and the input of the inverting gate 57.

Arranging the NOR gates 63 and 64 and inputting a set signal to them makes it possible to initialize the state holding circuit in which these NOR gates are arranged. Unlike the data holding circuit 10 described with reference to FIG. 3, the output of the data holding circuit 10 in the drawing at the time of initialization has a value of "1" (high level).

[Fourth modified example]

The data holding circuit 10 described above transfers data that has been input when the clock signal is at a low level. Alternatively, the data holding circuit 10 may transfer data when the clock signal is at a high level.

[Configuration of data holding circuit]

Figure 5:
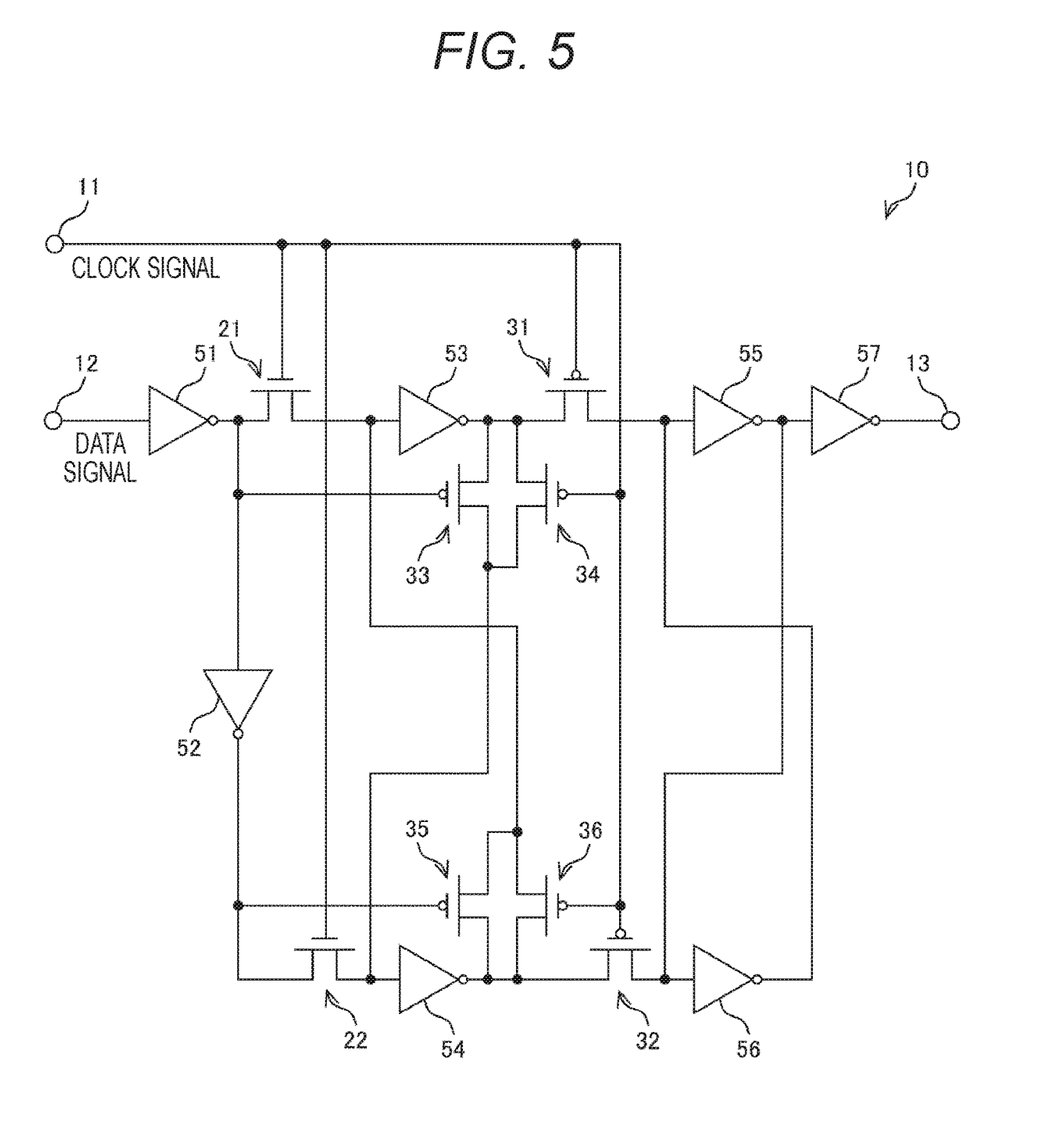
FIG. 5 is a diagram illustrating a configuration example of a data holding circuit according to a fourth modified example of the first embodiment of the present disclosure.

FIG. 5 is a diagram illustrating a configuration example of a data holding circuit according to a fourth modified example of the first embodiment of the present disclosure. The data holding circuit 10 in the drawing is different from the data holding circuit 10 described with reference to FIG. 1 in that n-channel MOS transistors are used for the MOS transistors 21 and 22 and p-channel MOS transistors are used for the MOS transistors 31 to 36.

In the data holding circuit 10 in the drawing, the data signal and the inverted data signal are transmitted to the inverting gates 53 and 54 when the clock signal is at a high level, and the states held in the inverting gates 53 and 54 are transmitted to the inverting gates 55 and 56 when the clock signal is at a low level.

As described above, the data holding circuit 10 of the first embodiment of the present disclosure connects the MOS transistor that transmits the data signal to the input of the inverting gate that constitutes the state holding circuit and the MOS transistor that constitutes the feedback path. At this time, the MOS transistor that constitutes the feedback path has a conductive channel type different from the MOS transistor that transmits the data signal, and a signal obtained by inverting the logic of the data signal is applied to the gate. As a result, a contention between the output voltage of the MOS transistor that transmits the data signal and the output voltage of the MOS transistor that constitutes the feedback path is avoided, and the MOS transistor that constitutes the feedback path transfers data when the drive capability of the MOS transistor that transmits the data signal is reduced. Thus, these MOS transistors can have the same size, and the size of the MOS transistors can be minimized. The data holding circuit 10 can be miniaturized.

<2. Second Embodiment>

The data holding circuit 10 of the first embodiment described above applies a data signal to the inputs of the inverting gates 53 and 54 constituting the first state holding circuit 110. On the other hand, a data holding circuit 10 of a second embodiment of the present disclosure is different from the first embodiment described above in that a data signal is input to a differential circuit arranged on a common side of an n-channel MOS transistor constituting an inverting gate of a state holding circuit.

[Configuration of data holding circuit]

Figure 6:
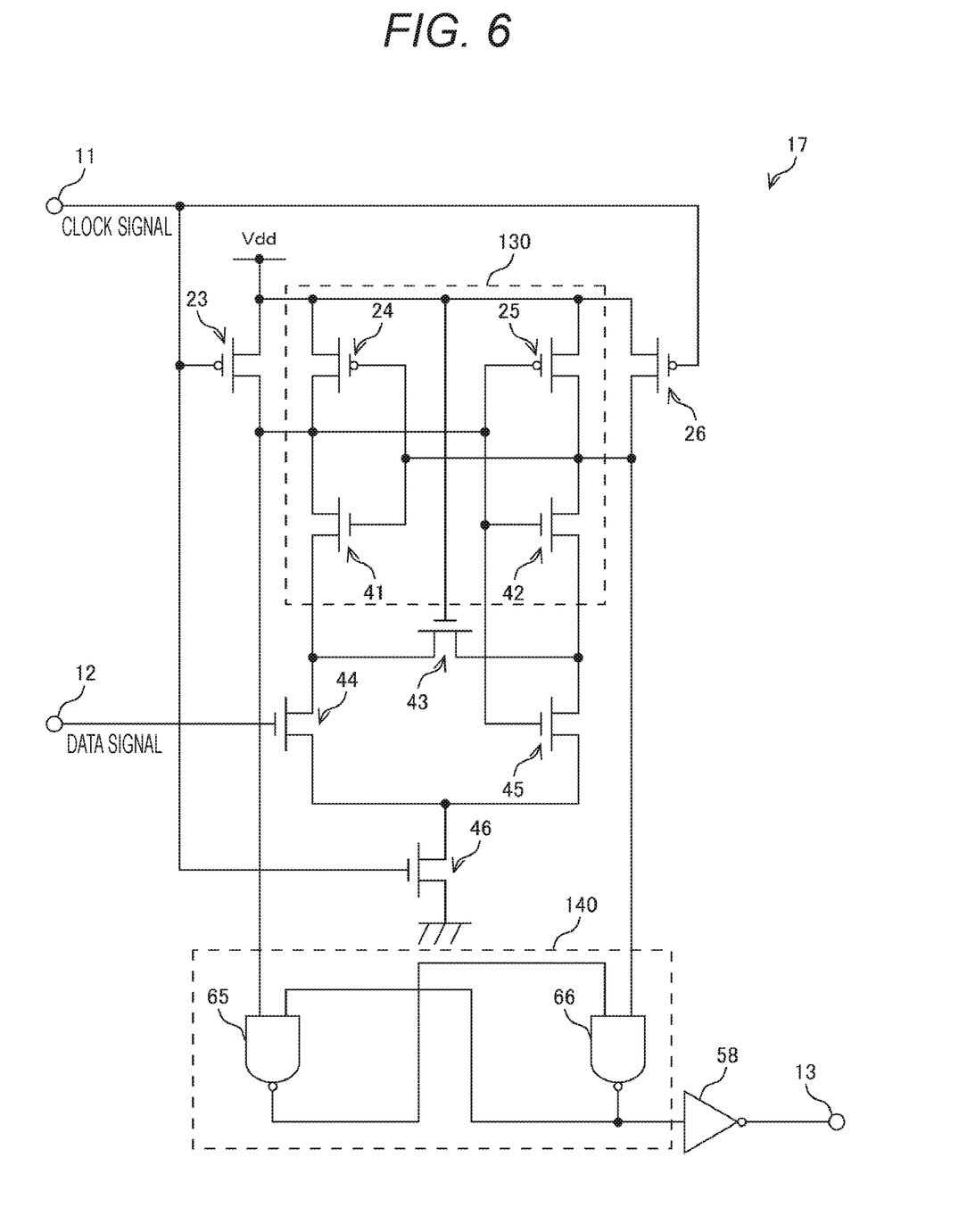
FIG. 6 is a diagram illustrating a configuration example of a data holding circuit according to a second embodiment of the present disclosure.

FIG. 6 is a diagram illustrating a configuration example of a data holding circuit according to the second embodiment of the present disclosure. A data holding circuit 17 in the drawing includes input terminals 11 and 12, an output terminal 13, MOS transistors 23 to 26, MOS transistors 41 to 46, NAND gates 65 and 66, and an inverting gate 58. As the MOS transistors 23 to 26, p-channel MOS transistors can be used. As the MOS transistors 41 to 46, n-channel MOS transistors can be used. Furthermore, as the NAND gates 65 and 66, two-input NAND gates can be used.

The input terminal 12 is connected to a gate of the MOS transistor 44, and a source of the MOS transistor 44 is connected to a source of the MOS transistor 45 and a drain of the MOS transistor 46. A drain of the MOS transistor 44 is connected to a source of the MOS transistor 41 and a source of the MOS transistor 43. A drain of the MOS transistor 43 is connected to a drain of the MOS transistor 45 and a source of the MOS transistor 42. A drain of the MOS transistor 41 is connected to a gate of the MOS transistor 25, a gate of the MOS transistor 42, a gate of the MOS transistor 45, a drain of the MOS transistor 24, and a drain of the MOS transistor 23. Furthermore, the drain of the MOS transistor 41 is further connected to an input of the NAND gate 65. The other input of the NAND gate 65 is connected to the output of the NAND gate 66 and the input of the inverting gate 58.

A gate of the MOS transistor 41 is connected to a gate of the MOS transistor 24, a drain of the MOS transistor 25, a drain of the MOS transistor 42, a drain of the MOS transistor 26, and an input of the NAND gate 66. The other input of the NAND gate 66 is connected to an output of the NAND gate 65. A gate of the MOS transistor 23, a gate of the MOS transistor 26, and a gate of the MOS transistor 46 are commonly connected to the input terminal 11. A source of the MOS transistor 23, a source of the MOS transistor 24, a gate of the MOS transistor 43, a source of the MOS transistor 25, and a source of the MOS transistor 26 are connected to a power supply line Vdd. A source of the MOS transistor 46 is grounded. An output of the inverting gate 58 is connected to the output terminal 13.

In a similar manner to the data holding circuit 10 described with reference to FIG. 1, a clock signal and a data signal are input to the input terminals 11 and 12, respectively. Each of the MOS transistors 24 and 41 and the MOS transistors 25 and 42 constitute an inverting gate. Furthermore, these two inverting gates constitute a state holding circuit 130. Furthermore, the NAND gates 65 and 66 constitute a state holding circuit 140.

The MOS transistors 23 and 26 transmit a state held in the state holding circuit 130 to the state holding circuit 140. When the clock signal is at a high level, the MOS transistor 23 becomes non-conductive, and outputs of the MOS transistors 24 and 41 constituting the inverting gate are transmitted to the NAND gate 65 of the state holding circuit 140. In a similar manner, when the clock signal is at a high level, the MOS transistor 26 becomes non-conductive, and outputs of the MOS transistors 25 and 42 are transmitted to the NAND gate 66. When the clock signal is at a low level, the MOS transistors 23 and 26 become conductive and the inputs of the NAND gates 65 and 66 are both at a high level, and the state of the state holding circuit 140 is maintained.

Furthermore, when the clock signal is at a low level, the gates of the MOS transistors 41, 42, and 45 are charged to a high level. After that, when the clock signal becomes a high level, the MOS transistor 46 becomes conductive. At this time, in a case where the data signal input from the input terminal 12 is at a high level, the MOS transistor 44 becomes conductive and the source of the MOS transistor 41 is at a low level. Since the gate of the MOS transistor 41 is charged to a high level, the MOS transistor 41 becomes conductive and the drain is at a low level. An inverted data signal (low level) is transmitted to the NAND gate 65. In this case, a high level is output to the output terminal 13.

On the other hand, in a case where the data signal input from the input terminal 12 is at a low level, the MOS transistor 44 becomes non-conductive. Since the gates of the MOS transistors 45 and 42 are charged to a high level, the MOS transistor 45 becomes conductive, and then the MOS transistor 42 becomes conductive. Thus, the drain of the MOS transistor 42 is at a low level, a data signal (low level) is transmitted to the NAND gate 66, and the low level is output to the output terminal 13. In this way, the signals (states) transmitted to the inputs of the NAND gates 65 and 66 are held in the state holding circuit 140.

As described above, in the data holding circuit 17 of the second embodiment of the present disclosure, input data can be transferred and held.

<3. Effects of Embodiments>

Effects of the data holding circuit 10 in the first embodiment and the data holding circuit 17 in the second embodiment described above will be described.

[Configuration of conventional data holding circuit]

Figure 7:
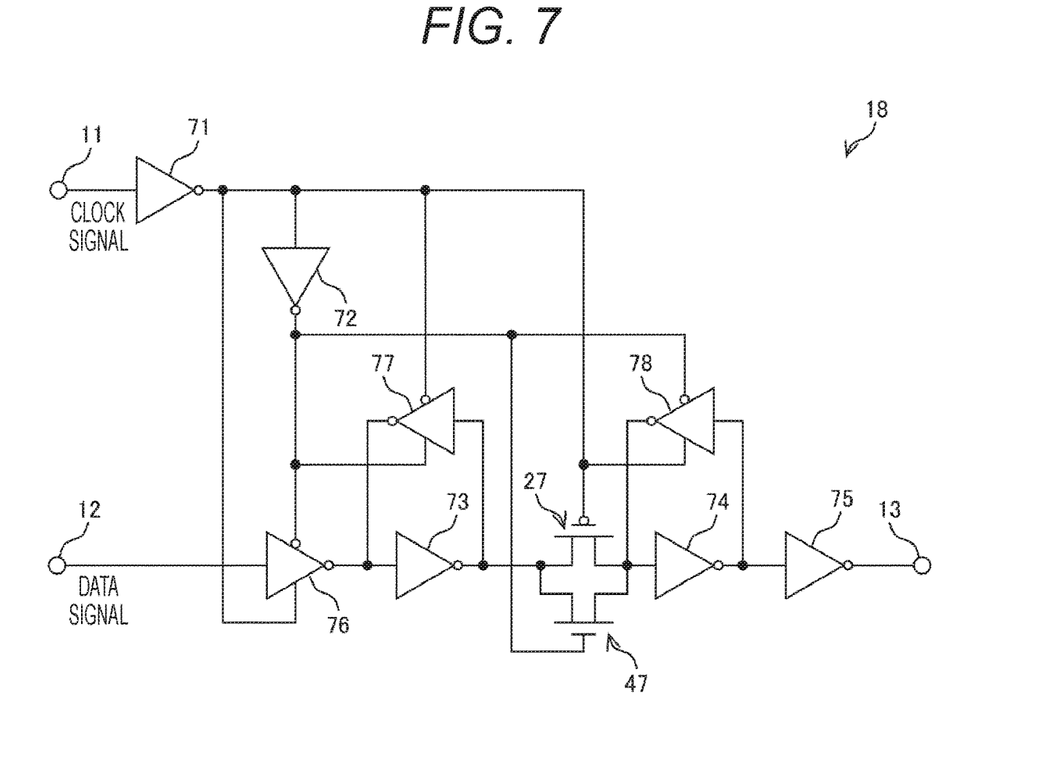
FIG. 7 is a diagram illustrating a configuration example of a conventional data holding circuit.

FIG. 7 is a diagram illustrating a configuration example of a conventional data holding circuit. The drawing illustrates a configuration of a data holding circuit 18, which is a comparative example. The data holding circuit 18 in the drawing includes MOS transistors 27 and 47 and inverting gates 71 to 78. As the MOS transistors 27 and 47, a p-channel MOS transistor and an n-channel MOS transistor can be used, respectively. Furthermore, clocked inverters can be used for the inverting gates 76 to 78.

Each of the inverting gates 73 and 77 and the inverting gates 74 and 78 constitute a state holding circuit. A clocked inverter is used to input a data signal to these state holding circuits, and a non-inverting gate circuit constituted by the MOS transistors 27 and 47 connected in parallel is used to transfer data between these state holding circuits. A clock signal and a signal obtained by inverting the clock signal are input to the clocked inverter and the non-inverting gate circuit.

[Comparison among data holding circuits]

Figure 8:
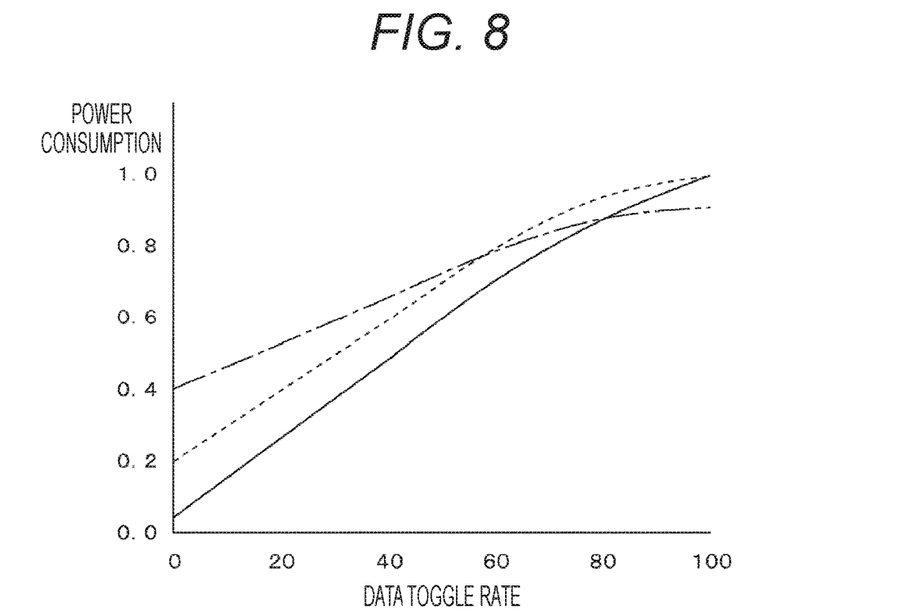
FIG. 8 is a diagram illustrating an example of power consumption of data holding circuits.

FIG. 8 is a diagram illustrating an example of power consumption of data holding circuits. The drawing illustrates a relationship between a data toggle rate and a power consumption in the data holding circuit 10 described with reference to FIG. 1, the data holding circuit 17 described with reference to FIG. 6, and the data holding circuit 18 described above. A horizontal axis in the drawing represents the data toggle rate. Here, the data toggle rate represents a ratio at which a data signal is inverted for each clock cycle. In a case where the data toggle rate is 100%, the input data signal is inverted for each clock cycle. Furthermore, a vertical axis in the drawing represents the power consumption. This power consumption is a value standardized with the power consumption of the data holding circuit 10 in a case where the data toggle rate is 100% set to a value "1". A solid line in the drawing represents the power consumption of the data holding circuit 10. An alternate long and short dash line in the drawing represents the power consumption of the data holding circuit 17. A broken line in the drawing represents the power consumption of the data holding circuit 18.

As illustrated in the drawing, the data holding circuit 10 consumes less power than the data holding circuit 18 in a case where the toggle rate is less than 100%, and consumes less power than the data holding circuit 17 in a region where the toggle rate is less than 80%. On the other hand, the data holding circuit 17 consumes less power than the data holding circuit 10 in a case where the toggle rate exceeds 80%. This is because the data holding circuit 17 has less elements than the data holding circuit 10. Since the data toggle rate in a normal LSI is 20% or less, adopting the data holding circuit 10 reduces the power consumption of an entire system.

<4. Example of Application to Standard Cell>

The data holding circuit 10 in the first embodiment described above can be used for a variety of electronic circuits. For example, the data holding circuit 10 described above can be used for a standard-cell type custom IC.

[Configuration of standard cell]

Figure 9:
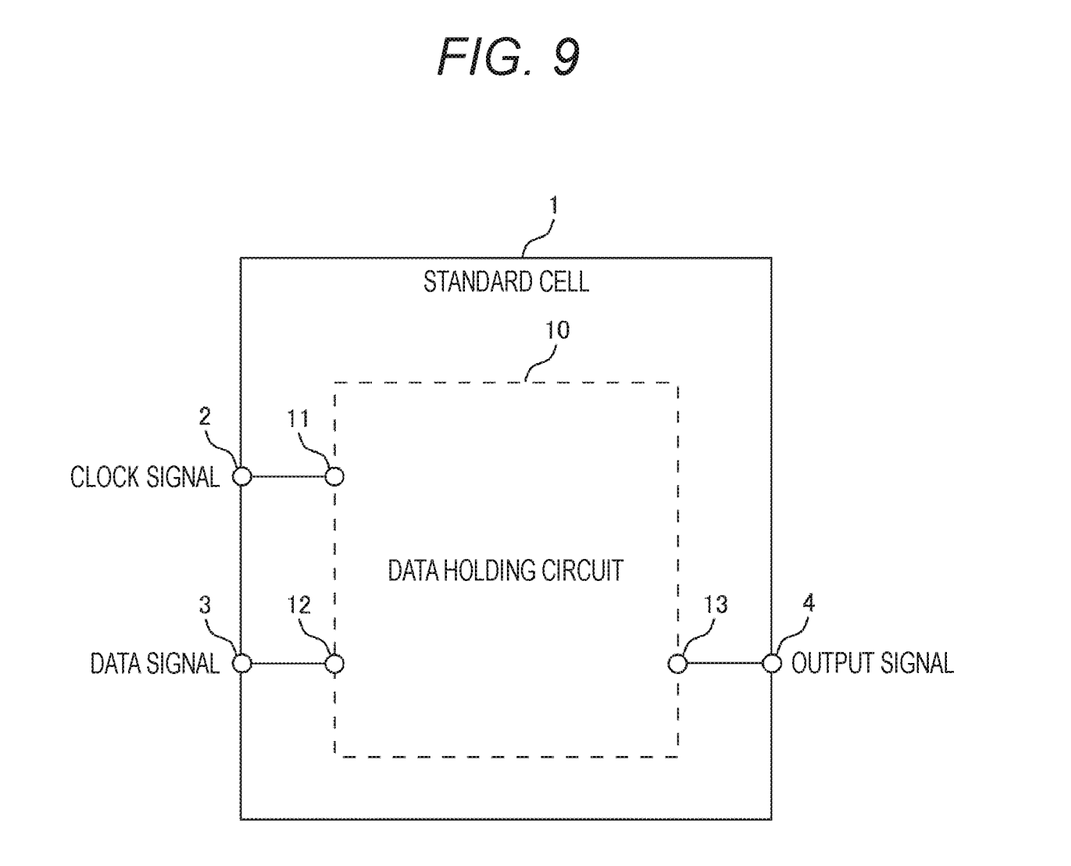
FIG. 9 is a diagram illustrating a configuration example of a standard cell to which the present disclosure can be applied.

FIG. 9 is a diagram illustrating a configuration example of a standard cell to which the present disclosure can be applied. The drawing is a block diagram illustrating a configuration example of a standard cell 1. The standard cell 1 in the drawing illustrates an example of being configured as a D-type flip-flop. Here, the standard-cell type is an example of a type of a custom IC in which the custom IC is formed by a combination of standardized semiconductor circuit libraries (cell libraries). It is possible to form a standard-cell type custom IC by combining semiconductor circuits such as the standard cell 1 in the drawing and forming mutual wiring.

The standard cell 1 in the drawing includes input terminals 2 and 3 and an output terminal 4. Furthermore, the standard cell 1 in the drawing includes the data holding circuit 10. That is, the standard cell 1 in the drawing is constituted by the data holding circuit 10.

The input terminals 2 and 3 are connected to the input terminals 11 and 12 of the data holding circuit 10, respectively. A clock signal and a data signal are input to the input terminals 2 and 3, respectively. The output terminal 4 is connected to the output terminal 13 of the data holding circuit. On the basis of the clock signal input to the input terminal 2, the data signal input to the input terminal 3 is held in the standard cell 1. The held data is output to the output terminal 4. The standard cell 1 is constituted by the data holding circuit 10, and this enables miniaturization as described previously.

As illustrated in the drawing, the input terminal 2 is directly connected with the input terminal 11 of the data holding circuit 10. That is, the clock signal input to the input terminal 2 is transmitted to the input terminal 11 of the data holding circuit 10 without passing through the buffer. As described with reference to FIG. 1, the input terminal 11 of the data holding circuit 10 is directly connected to gates of the MOS transistor 21 and the like. Thus, the standard cell 1 does not include a buffer for clock signals, and the power consumption can be reduced. Note that, in order to shape a clock signal that has attenuated in the process of signal transmission, it is possible to arrange a buffer in, for example, a stage preceding the input terminal 2 of the standard cell 1. In this case, a clock signal can be commonly supplied from one buffer to the input terminals 2 of a plurality of the standard cells 1.

Lastly, the description of each embodiment described above is an example of the present disclosure, and the present disclosure is not limited to the above-described embodiments. Thus, it goes without saying that, besides the above-described embodiments, various changes can be made in accordance with a design or the like within the technical idea according to the present disclosure.

Note that the present technology can also be configured as described below.

(1) A data holding circuit including:

a state holding circuit that holds two states and is constituted by a first inverting gate and a second inverting gate in which an output of each inverting gate is fed back to an input of another inverting gate by cross-connected feedback paths;

a first MOS transistor that transmits a data signal to the input of the first inverting gate when a clock signal is at a first level;

a second MOS transistor that transmits an inverted data signal obtained by inverting the data signal, to the input of the second inverting gate when the clock signal is at the first level;

a third MOS transistor that transmits the state held in the first inverting gate when the clock signal is at a second signal level;

a fourth MOS transistor that transmits the state held in the second inverting gate when the clock signal is at the second signal level;

a fifth MOS transistor that is inserted in the feedback path from the output of the second inverting gate to the input of the first inverting gate and transmits the output of the second inverting gate to the input of the first inverting gate when the clock signal is at the second signal level;

a sixth MOS transistor that is inserted in the feedback path from the output of the first inverting gate to the input of the second inverting gate and transmits the output of the first inverting gate to the input of the second inverting gate when the clock signal is at the second signal level;

a seventh MOS transistor that is constituted in a channel of a conductive type different from the first MOS transistor and connected in parallel to the fifth MOS transistor, and transmits the output of the second inverting gate to the input of the first inverting gate on the basis of the inverted data signal; and an eighth MOS transistor that is constituted in a channel of a conductive type different from the second MOS transistor and connected in parallel to the sixth MOS transistor, and transmits the output of the first inverting gate to the input of the second inverting gate on the basis of the data signal.

(2) The data holding circuit according to (1), further including:

a second state holding circuit that holds the states transmitted by the third MOS transistor and the fourth MOS transistor; and an output unit that transmits the state held in the second state holding circuit as an output signal.

(3) The data holding circuit according to (1), in which the data holding circuit constitutes a standard cell.

(4) The data holding circuit according to (3), in which the clock signal is input from an input terminal of the standard cell to the data holding circuit without passing through a buffer.

(5) A data holding circuit including:

a first MOS transistor to which a data signal is input;

a first inverting gate that has an input to which an output of the first MOS transistor is connected;

a third MOS transistor that has an input to which an output of the first inverting gate is connected;

a sixth MOS transistor and an eighth MOS transistor that are connected in parallel to each other and have inputs to which the output of the first inverting gate is connected;

a third inverting gate that has an input to which an output of the third MOS transistor is connected;

a second MOS transistor to which an inverted data signal obtained by logically inverting the data signal is input;

a second inverting gate that has an input to which an output of the second MOS transistor is connected;

a fourth MOS transistor that has an input to which an output of the second inverting gate is connected;

a fifth MOS transistor and a seventh MOS transistor that are connected in parallel to each other and have inputs to which the output of the second inverting gate is connected; and a fourth inverting gate that has an input to which an output of the fourth MOS transistor is connected, in which outputs of the sixth MOS transistor and the eighth MOS transistor are further connected to the input of the second inverting gate, outputs of the fifth MOS transistor and the seventh MOS transistor are further connected to the input of the first inverting gate, an output of the third inverting gate is further connected to the input of the fourth inverting gate, an output of the fourth inverting gate is further connected to the input of the third inverting gate, the same control signal is input to gates of the first to sixth MOS transistors, the data signal is input to a gate of the eighth MOS transistor, the inverted data signal is input to a gate of the seventh MOS transistor, and the first and second MOS transistors are constituted in a conductive channel type different from the third to eighth MOS transistors.

REFERENCE SIGNS LIST

1 Standard cell
10, 17, 18 Data holding circuit
21 to 26, 31 to 36, 41 to 46 MOS transistor
51 to 58 Inverting gate
61 to 64 NOR gate
65, 66 NAND gate
110, 120, 130, 140 State holding circuit

The invention claimed is:

1. A data holding circuit comprising:
a state holding circuit that holds two states and is constituted by a first inverting gate and a second inverting gate in which an output of each inverting gate is fed back to an input of another inverting gate by cross-connected feedback paths;
a first MOS transistor that transmits a data signal to the input of the first inverting gate when a clock signal is at a first level;
a second MOS transistor that transmits an inverted data signal obtained by inverting the data signal, to the input of the second inverting gate when the clock signal is at the first level;
a third MOS transistor that transmits a state held in the first inverting gate when the clock signal is at a second signal level;
a fourth MOS transistor that transmits a state held in the second inverting gate when the clock signal is at the second signal level;
a fifth MOS transistor that is inserted in a feedback path from the output of the second inverting gate to the input of the first inverting gate and transmits the output of the second inverting gate to the input of the first inverting gate when the clock signal is at the second signal level;
a sixth MOS transistor that is inserted in a feedback path from the output of the first inverting gate to the input of the second inverting gate and transmits the output of the first inverting gate to the input of the second inverting gate when the clock signal is at the second signal level;
a seventh MOS transistor that is constituted in a channel of a conductive type different from the first MOS transistor and connected in parallel to the fifth MOS transistor, and transmits the output of the second inverting gate to the input of the first inverting gate on a basis of the inverted data signal; and
an eighth MOS transistor that is constituted in a channel of a conductive type different from the second MOS transistor and connected in parallel to the sixth MOS transistor, and transmits the output of the first inverting gate to the input of the second inverting gate on a basis of the data signal.

2. The data holding circuit according to claim 1, further comprising:
a second state holding circuit that holds the states transmitted by the third MOS transistor and the fourth MOS transistor; and
an output unit that transmits the states held in the second state holding circuit as an output signal.

3. The data holding circuit according to claim 1, wherein the data holding circuit constitutes a standard cell.

4. The data holding circuit according to claim 3, wherein the clock signal is input from an input terminal of the standard cell to the data holding circuit without passing through a buffer.

5. A data holding circuit comprising:
a first MOS transistor to which a data signal is input;
a first inverting gate that has an input to which an output of the first MOS transistor is connected;
a third MOS transistor that has an input to which an output of the first inverting gate is connected;

a sixth MOS transistor and an eighth MOS transistor that are connected in parallel to each other and have inputs to which the output of the first inverting gate is connected;

a third inverting gate that has an input to which an output of the third MOS transistor is connected;

a second MOS transistor to which an inverted data signal obtained by logically inverting the data signal is input;

a second inverting gate that has an input to which an output of the second MOS transistor is connected;

a fourth MOS transistor that has an input to which an output of the second inverting gate is connected;

a fifth MOS transistor and a seventh MOS transistor that are connected in parallel to each other and have inputs to which the output of the second inverting gate is connected; and a fourth inverting gate that has an input to which an output of the fourth MOS transistor is connected, wherein outputs of the sixth MOS transistor and the eighth MOS transistor are further connected to the input of the second inverting gate, outputs of the fifth MOS transistor and the seventh MOS transistor are further connected to the input of the first inverting gate, an output of the third inverting gate is further connected to the input of the fourth inverting gate, an output of the fourth inverting gate is further connected to the input of the third inverting gate, the same control signal is input to gates of the first to sixth MOS transistors, the data signal is input to a gate of the eighth MOS transistor, the inverted data signal is input to a gate of the seventh MOS transistor, and the first and second MOS transistors are constituted in a conductive channel type different from the third to eighth MOS transistors.

* * * * *